(12) United States Patent
Miyaguchi

(10) Patent No.: US 7,193,252 B2
(45) Date of Patent: Mar. 20, 2007

(54) SOLID-STATE IMAGING DEVICE AND SOLID-STATE IMAGING DEVICE ARRAY

(75) Inventor: Kazuhisa Miyaguchi, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 249 days.

(21) Appl. No.: 10/515,548

(22) PCT Filed: May 2, 2003

(86) PCT No.: PCT/JP03/05610

§ 371 (c)(1), (2), (4) Date: Nov. 24, 2004

(87) PCT Pub. No.: WO03/100862

PCT Pub. Date: Dec. 4, 2003

(65) Prior Publication Data

US 2005/0151169 A1 Jul. 14, 2005

(30) Foreign Application Priority Data

May 27, 2002 (JP) .............................. 2002-153035

(51) Int. Cl.
- H01L 27/148 (2006.01)
- H01L 29/765 (2006.01)
- H04N 5/335 (2006.01)
- H01L 21/00 (2006.01)

(52) U.S. Cl. .......... 257/249; 257/E27.15; 257/E27.152

(58) Field of Classification Search ................ 257/225, 257/233, 242, 249, E27.083, E27.15, E27.152, 257/E27.157

See application file for complete search history.

(56) References Cited

U.S. PATENT DOCUMENTS

| | | | |
|---|---|---|---|
| 4,455,574 A | * | 6/1984 | Hashimoto et al. .......... 348/257 |
| 4,689,687 A | | 8/1987 | Koike et al. ........... 358/213.24 |
| 4,740,681 A | | 4/1988 | Tsuno |

(Continued)

FOREIGN PATENT DOCUMENTS

EP  1 102 323  5/2001

(Continued)

*Primary Examiner*—Anh Duy Mai
(74) *Attorney, Agent, or Firm*—Drinker Biddle & Reath LLP

(57) ABSTRACT

In a photosensitive part 10, arranged from pixels A aligned in n rows and m columns, supply wiring lines 13a and 13b, which are electrically connected and apply transfer voltages to transfer electrodes 12a to 12d, formed of polycrystalline silicon, are installed so as to cover parts of the top surfaces of light-shielded pixels D. Dead zones for installing supply wiring lines, which existed priorly at the respective end parts in a horizontal direction of a photosensitive part, can thereby be eliminated and the photosensitive part can be made wide. Also, in the case where a plurality of the solid-state image pickup devices are used upon being made adjacent each other in the horizontal direction, parts at which image pickup is not carried out can be lessened. Also, the amount of lowering of the amounts of incident light on light-shielded pixels D can be corrected based on the output signals from light-shielded pixels D or other pixels A. By the above, a solid-state image pickup device, with which the dead zones can be made small and the photosensitive part can be made wide, and a solid-state image pickup device array, using such solid-state image pickup devices, can be realized.

10 Claims, 7 Drawing Sheets

U.S. PATENT DOCUMENTS

| | | | |
|---|---|---|---|
| 4,972,254 A | | 11/1990 | Endo et al. |
| 5,483,090 A | * | 1/1996 | Kitamura et al. ............ 257/231 |
| 5,508,740 A | * | 4/1996 | Miyaguchi et al. ......... 348/244 |
| 5,519,207 A | * | 5/1996 | Morimoto ................ 250/208.1 |
| 5,530,475 A | * | 6/1996 | Kannegundla et al. ...... 348/322 |
| 5,821,547 A | * | 10/1998 | Talmi et al. ............. 250/458.1 |
| 6,310,370 B1 | | 10/2001 | Inoue et al. ................ 257/241 |
| 7,031,556 B1 | * | 4/2006 | Etoh .......................... 382/312 |
| 2002/0140997 A1 | * | 10/2002 | McDermott et al. ........ 358/504 |
| 2004/0169750 A1 | * | 9/2004 | Miyahara et al. ........... 348/294 |
| 2005/0001914 A1 | * | 1/2005 | Kueny ....................... 348/294 |

FOREIGN PATENT DOCUMENTS

| | | | |
|---|---|---|---|
| GB | 2 328 338 | | 2/1999 |
| JP | 06-077460 | | 3/1994 |
| JP | 06-078224 | * | 3/1994 |
| JP | 07-235656 | * | 9/1995 |
| JP | 2000-069373 | * | 3/2000 |
| JP | 2000-101061 | | 4/2000 |
| JP | 2002-289822 | * | 10/2002 |

* cited by examiner

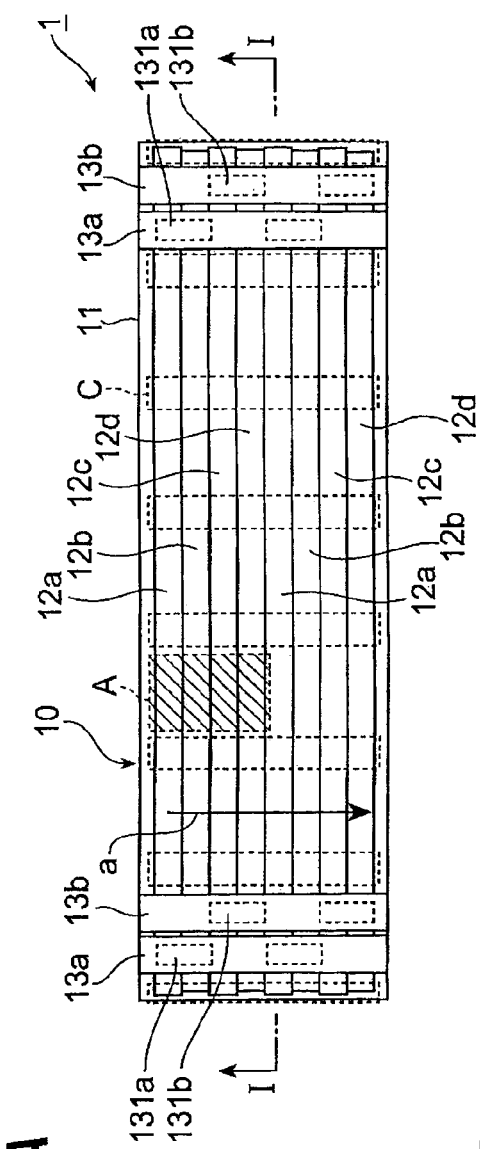
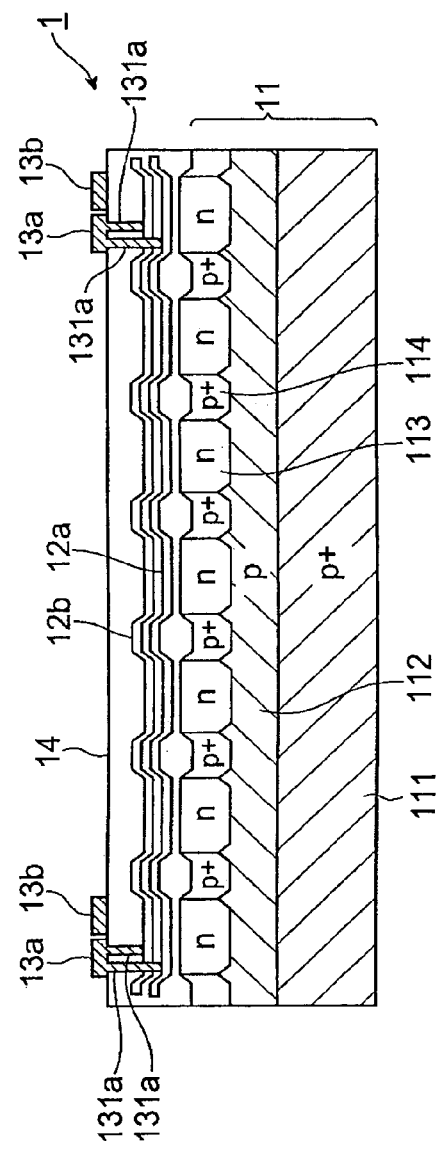
Fig.2A
Fig.2B

Fig.3A

| PIXEL NO. | OUTPUT NO. |
|---|---|
| ch1 | 100 |
| ch2 | 101 |
| ch3 | 99 |
| ch4 | 100 |
| ch1021 | 101 |
| ch1022 | 100 |
| ch1023 | 100 |
| ch1024 | 99 |

Fig.3B

| PIXEL NO. | OUTPUT NO. |
|---|---|
| ch1 | 100 |
| ch2(LIGHT-SHIELDED PIXELS) | 50 |
| ch3(LIGHT-SHIELDED PIXELS) | 51 |
| ch4 | 99 |
| ch1021 | 100 |
| ch1022(LIGHT-SHIELDED PIXELS) | 49 |
| ch1023(LIGHT-SHIELDED PIXELS) | 50 |
| ch1024 | 99 |

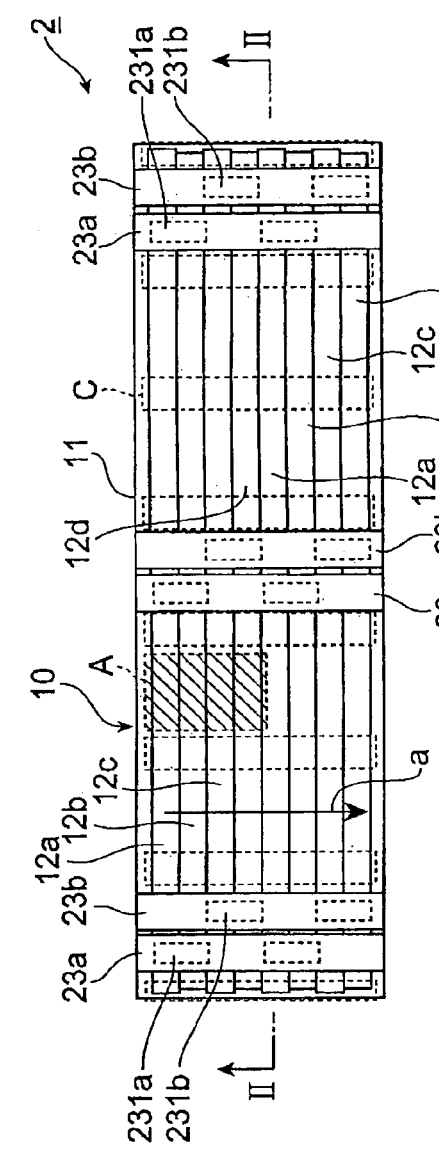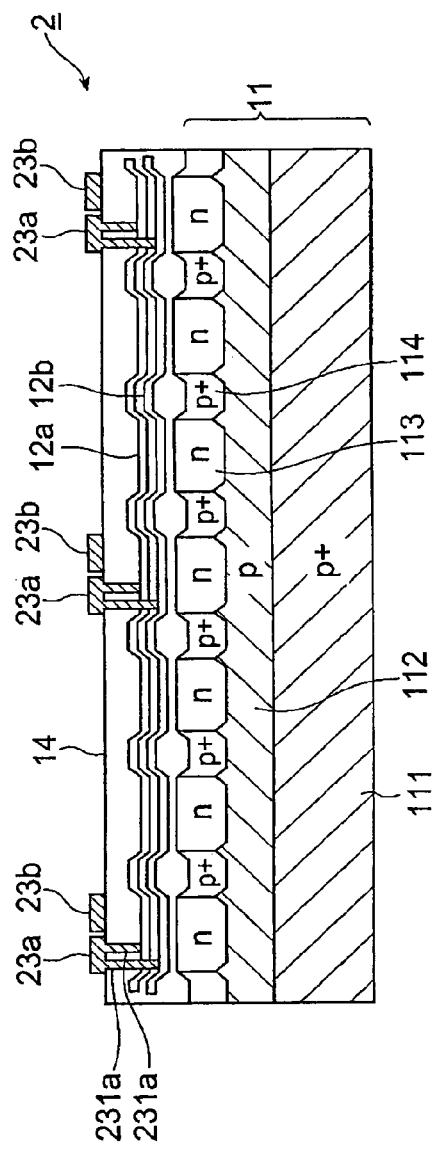
Fig.5A
Fig.5B

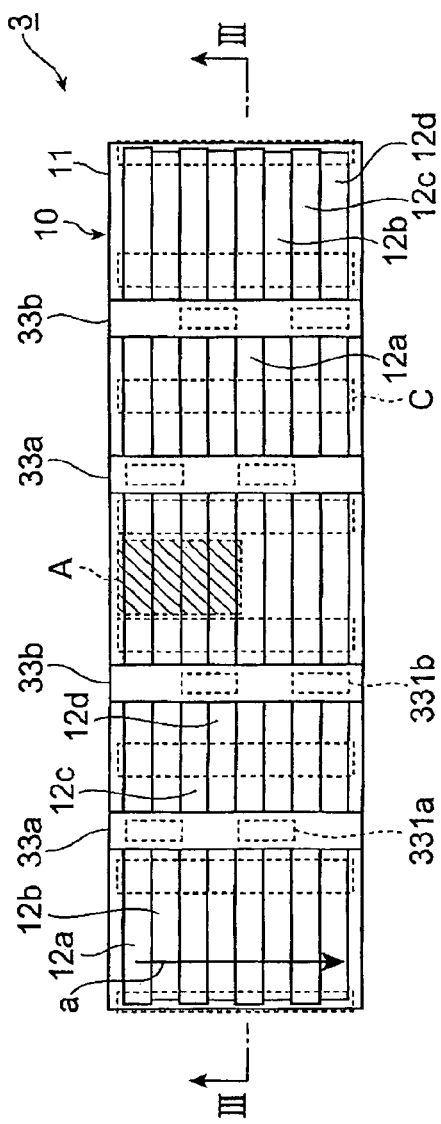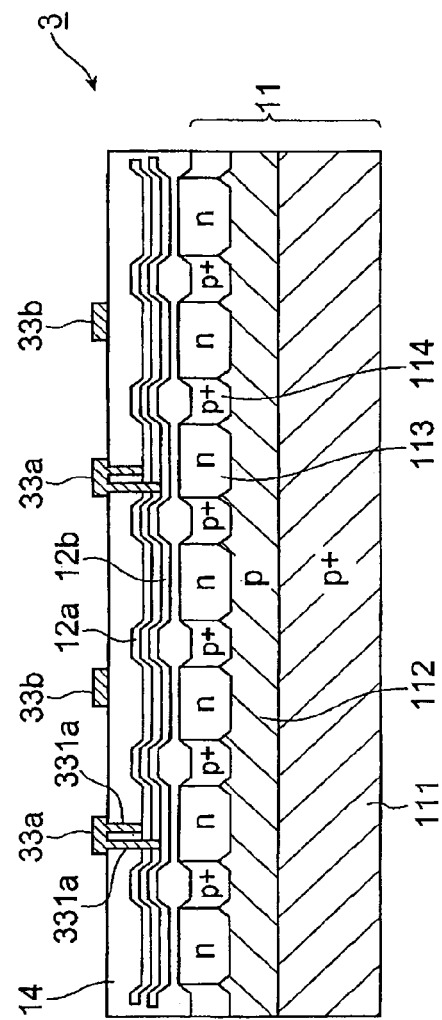
Fig.6A
Fig.6B

SOLID-STATE IMAGING DEVICE AND SOLID-STATE IMAGING DEVICE ARRAY

TECHNICAL FIELD

This invention concerns a solid-state image pickup device and a solid-state image pickup device array.

BACKGROUND ART

FIG. 7A shows a top view of a prior-art full-frame transfer solid-state image pickup device (FFT CCD) or frame transfer (FT) CCD for the case of two-phase drive, and FIG. 7B shows a sectional view of the same along arrows IV—IV.

A CCD 100 comprises a semiconductor substrate 101, transfer electrodes 102, set on a top surface side of semiconductor substrate 101, and supply wiring lines 103, electrically connected to transfer electrodes 102. A photosensitive part, which picks up an image of light that is made incident on CCD 100, is arranged. The photosensitive part has a plurality of pixels E aligned in a horizontal direction and a vertical direction. By light being made incident on pixels E, charges are generated in the interiors of pixels E and image pickup of the image of light is carried out thereby.

For each single pixel E, a predetermined number of transfer electrodes 102 are set on top of pixel E with their longitudinal direction being set along the horizontal direction of the photosensitive part and, by being supplied vertical transfer voltages, transfer charges in the vertical direction. Supply wiring lines 103 are the wiring for supplying the transfer voltages to the transfer electrodes 102 and are disposed, with their longitudinal direction being set along the vertical direction, at the respective end parts of CCD 100, which are dead zones F where an image of light is not picked up.

When an image of light is made incident from the top surface side of CCD 100, charges are generated in the interiors of pixels E. Then by the vertical transfer voltages being supplied to transfer electrodes 102 via supply wiring lines 103, the charges are transferred inside pixels E in the direction of arrow c.

With an FFT CCD or an FT CCD, a polycrystalline silicon (polysilicon) or other light transmitting material is used as the material of transfer electrodes 102. Supply wiring lines 103, which are formed of aluminum or other metal and are disposed at the respective ends of transfer electrodes 102, are used for supplying voltages to transfer electrodes 102.

DISCLOSURE OF THE INVENTION

Since supply wiring lines 103, which are formed of aluminum, etc., block light, in the prior-art CCD, supply wiring lines 103 are installed at dead zones F at the respective end parts of CCD 100 as described above. However, the existence of dead zones F is a problem in terms of making effective use of the surface of CCD 100, and thus dead zones F are preferably as small as possible. Such dead zones F also present problems in cases where a plurality of solid-state image pickup devices are aligned so as to be adjacent each other in the horizontal direction. That is, by dead zones F existing between the plurality of aligned solid-state image pickup elements, parts of an image of light will not be picked up.

This invention has been made to resolve the above issues and an object thereof is to provide a solid-state image pickup device, with which dead zones can be made small and a photosensitive part can be made wide, and a solid-state image pickup device array that uses such solid-state image pickup devices.

In order to achieve the above object, this invention provides a solid-state image pickup device comprising: a photosensitive part, having m×n pixels, formed on a semiconductor substrate, which includes a p-type semiconductor layer and an n-type semiconductor layer, and aligned two-dimensionally along m columns (where m is an integer of 2 or more), which partition a horizontal direction, and n rows (where n is an integer of 2 or more), which partition a vertical direction, and picking up an image of light that is made incident thereon; a transfer electrode, being installed on top of the pixels with the longitudinal direction thereof being set along the horizontal direction of the photosensitive part and being applied a vertical transfer voltage that transfers charges generated in the pixels in the vertical direction; and a supply wiring line, formed of metal or metal silicide, installed so as to cover a part of a light-shielded pixel, which is a predetermined pixel among the pixels, and with the longitudinal direction thereof being set along the vertical direction of the photosensitive part, being electrically connected to the transfer electrode, and applying the vertical transfer voltage to the transfer electrode; wherein being arranged to enable correction of the amount of lowering of an output signal, output by the light-shielded pixel, due to the supply wiring line.

With this invention's solid-state image pickup device, since dead zones for installing supply wiring lines at the respective end parts in the horizontal direction of the photosensitive part can be eliminated by the installing of the supply wiring line, formed of metal or metal silicide that blocks light, on top of pixels, the photosensitive part can be made wide. Also by eliminating the dead zones, parts at which image pickup cannot be performed can be lessened in cases where a plurality of the solid-state image pickup devices are used upon being made adjacent each other in the horizontal direction. Also, the supply wiring line is arranged to cover only a part of the light-shielded pixel. Since light is made incident on the other part of the light-shielded pixel, an output signal, which is lowered to some degree in output amount, is output from the light-shielded pixel. Thus with the solid-state image pickup device of the above arrangement, the lowering of the incident light amount on the light-shielded pixel can be corrected based on the output signal.

Also, this invention's solid-state image pickup device array is characterized in that a plurality of the above-described solid-state image pickup devices are aligned in a mutually adjacent manner with the photosensitive parts aligned in the horizontal direction. Since the above-described solid-state image pickup device does not require dead zones for installing supply wiring lines, by aligning a plurality of the solid-state image pick-up devices, the intervals between the respective photosensitive parts can be made narrow. Non-image-pickup parts that exist in an image that has been picked up by the solid-state image pickup device array can thus be made small.

BRIEF DESCRIPTION OF THE DRAWINGS

FIG. 2A and FIG. 2B are (A) a top view and (B) a section along arrows I—I showing a part of the arrangement of a CCD of the solid-state image pickup device shown in FIG. 1.

FIG. 3A and FIG. 3B are tables showing (A) an example of output signal data from pixels A and (B) an example of output signal data from light-shielded pixels D and pixels A in an FFT CCD with 1024 columns and 64 rows.

FIG. 5A and FIG. 5B are (A) a top view and (B) a section along arrows II—II showing a part of the arrangement of a CCD of a solid-state image pickup device of a second embodiment.

FIG. 6A and FIG. 6B are (A) a top view and (B) a section along arrows III—III showing a part of the arrangement of a CCD of a solid-state image pickup device of a third embodiment.

BEST MODE FOR CARRYING OUT THE INVENTION

Figure 1:
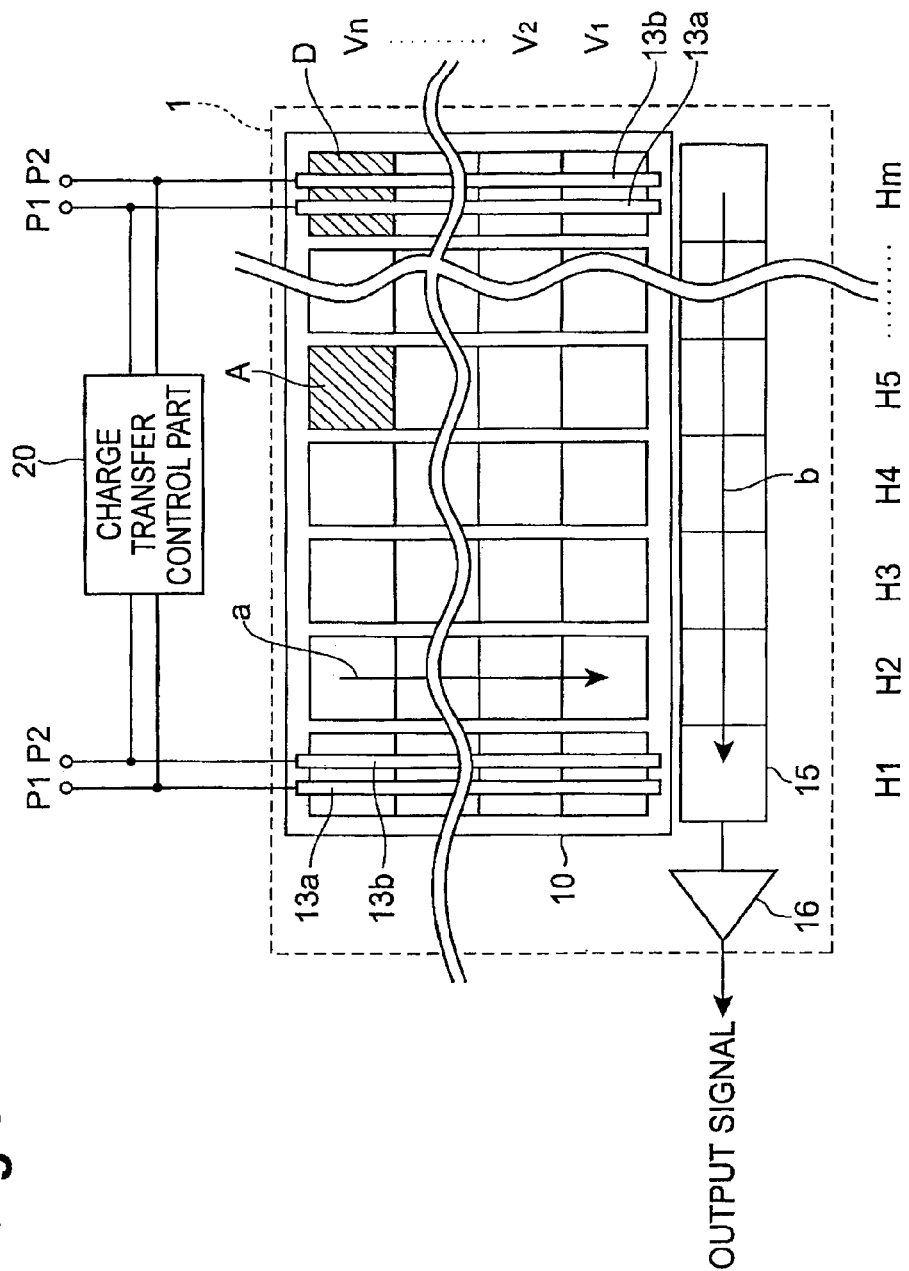
FIG. 1 is a schematic arrangement diagram of a first embodiment of this invention's solid-state image pickup device as viewed from the top surface side.

Preferred embodiments of this invention's solid-state image pickup device and solid-state image pickup device array shall now be described along with the drawings. In the description of the drawings, the same elements shall be provided with the same symbols and redundant description shall be omitted. Also, the dimensional proportions in the drawings may not necessarily match those of the description.

FIG. 1 is a schematic arrangement diagram of a first embodiment of this invention's solid-state image pickup device as viewed from the top surface side. In this embodiment, the solid-state image pickup device is equipped with a two-phase drive FFT CCD. This FFT CCD has an arrangement wherein charges, which are generated by the incidence of an image of light from the top surface side of a photosensitive part, are transferred in the photosensitive part.

This solid-state image pickup device is arranged from a CCD 1, which is an FFT CCD, and a charge transfer control part 20. Of these, CCD 1 is equipped with a photosensitive part 10, a horizontal shift register 15, and an amplifying part 16.

Photosensitive part 10 is divided in its horizontal direction into m columns H1 to Hm (where m is an integer of 2 or more), each having its longitudinal direction aligned along the vertical direction, and is divided in its vertical direction into n rows V1 to Vn (where n is an integer of 2 or more), each having its longitudinal direction aligned along the horizontal direction, and is thereby arranged from m×n pixels A. When an image of light is made incident from the top surface side of photosensitive part 10, charges are generated inside pixels A.

Transfer electrodes (not shown), which are formed of polycrystalline silicon, etc. that has a light transmitting property, cover the entirety of photosensitive part 10 at the top surface side of photosensitive part 10 and are positioned in the direction (horizontal direction) parallel to the longitudinal direction of the respective rows Vj (j=1 to n). In accordance to two-phase drive, two or four transfer electrodes are installed for each row. Supply wiring lines 13a and 13b, for supplying vertical transfer voltages P1 and P2, which are in accordance with two-phase drive, to the transfer electrodes, are installed with their longitudinal direction being set in the direction (vertical direction) parallel to the longitudinal directions of the respective columns Hi (i=1 to m) of photosensitive part 10.

These supply wiring lines 13a and 13b are formed of aluminum or other metal or metal silicide of low electrical resistance and are installed on top of the pixels of columns H1 and Hm, which among the m columns are located at the respective ends of photosensitive part 10, so as to cover a part of each pixel. Here, since a part of each light-shielded pixel D that is covered by supply wiring lines 13a or 13b is not covered and light is made incident thereon, charges due to this part is generated in each light-shielded pixel D. Also supply wiring lines 13a and 13b are installed in a manner such that one set of wiring lines, comprising the two wiring lines of one each of supply wiring lines 13a and 13b, is installed per column.

Supply wiring line 13a is electrically connected to corresponding transfer electrode among the two to four transfer electrodes that are installed for each row Vj and supplies transfer voltage P1 to the transfer electrode. Supply wiring line 13b is likewise electrically connected to corresponding transfer electrode and supplies transfer voltage P2 to the transfer electrode. By these vertical transfer voltages P1 and P2 being supplied to the transfer electrodes, a vertical shift register, which accumulates the charges generated in the interior of pixels A and transfers these charges in the vertical direction (direction of arrow a in the Figure), is arranged. By vertical transfer voltages P1 and P2 being controlled by charge transfer control part 20, the charges inside pixels A are transferred.

Horizontal shift register 15 receives the charges, which were generated in the respective pixels A and were transferred in the vertical direction of photosensitive part 10, from photosensitive part 10, transfers these charges in the horizontal direction (arrow b), and outputs the charges to amplifying part 16. The charges output from horizontal shift register 15 are amplified by amplifying part 16 and are then output to the exterior of the solid-state image pickup device as output signals according to the respective pixels.

FIG. 2A and FIG. 2B are (A) a top view and (B) a section along arrows I—I showing a part of the arrangement of CCD 1 of the solid-state image pickup device shown in FIG. 1. CCD 1, shown in FIG. 2A and FIG. 2B, comprises a semiconductor substrate 11, transfer electrodes 12a to 12d, supply wiring lines 13a and 13b, and an insulating layer 14.

Semiconductor substrate 11 comprises a $p^+$ type semiconductor substrate 111, which is of a $p^+$ conduction type and serves as the base of semiconductor substrate 11, a p-type semiconductor layer 112, which is an epitaxial layer that is formed on the top surface side of $p^+$ type semiconductor substrate 111, and an n-type semiconductor layer 113 and a $p^+$ type semiconductor layer 114, which are formed further on the top surface side. N-type semiconductor layer 113 and $p^+$ type semiconductor layer 114 are disposed in alternating manner in the horizontal directions with the vertical direction of photosensitive part 10 being their longitudinal direction. N-type semiconductor layer 113 and p-type semiconductor layer 112 form a pn junction, and n-type semiconductor layer 113 serves as a photosensitive region that generates charges upon incidence of an image of light. N-type semiconductor layer 113 forms the respective columns Hi (i=1 to m) of photosensitive part 10. $P^+$-type semiconductor layer 114 form isolation regions C that separate the respective columns Hi.

Also, transfer electrodes 12a to 12d are installed via insulating layer 14 on the top surface of semiconductor substrate 11. Transfer electrodes 12a to 12d are installed in an alternating manner in the vertical direction with their longitudinal direction set along the direction parallel to the horizontal direction of photosensitive part 10 and form the respective rows Vj (j=1 to n) Pixels A, which are aligned in n rows and m columns, are thus formed by n-type semiconductor layer 113 and transfer electrodes 12a to 12d.

Supply wiring line 13a is electrically connected to transfer electrodes 12a and 12b and vertical transfer voltage P1 is supplied to transfer electrodes 12a and 12b. Likewise, supply wiring line 13b is electrically connected to transfer electrodes 12c and 12d and vertical transfer voltage P2 is supplied to transfer electrodes 12c and 12d. That is, with respect to semiconductor substrate 11, the set of transfer electrodes 12a and 12b apply a vertical transfer voltage of one phase and the set of transfer electrodes 12c and 12d apply a vertical transfer voltage of another phase.

As the materials of insulating layer 14, which insulates semiconductor substrate 11, transfer electrodes 12a to 12d, and supply wiring lines 13a and 13b from each other, oxide films, etc., that transmit light are used.

Supply wiring lines 13a and 13b are installed on the top surface of columns H1 and Hm of photosensitive part 10 with their longitudinal direction being set along the direction parallel to the respective columns Hi of photosensitive part 10. Also, a protruding part 131a is disposed at the semiconductor substrate 11 side of the supply wiring line 13a, and protruding part 131a is electrically connected to transfer electrodes 12a and 12b. Likewise, a protruding part 131b (not shown in FIG. 2B) is disposed at the semiconductor substrate 11 side of the supply wiring line 13b, and protruding part 131b is electrically connected to transfer electrodes 12c and 12d.

With the solid-state image pickup device of the present embodiment, when an image of light is made incident from the top surface side of photosensitive part 10, the image of light is transmitted through transfer electrodes 12a to 12d and insulating layer 14 and reaches the interiors of the respective pixels A of photosensitive part 10. Charges are then generated in the interiors of the respective pixels A. These charges are held once in the interiors of pixels A and then transferred in the vertical direction by vertical transfer voltages P1 and P2 being applied to the corresponding transfer electrodes 12a to 12d and by these voltages being controlled by charge transfer control part 20. The transferred charges are then output to horizontal shift register 15. The charges are then transferred in the horizontal direction by horizontal shift register 15 and then input into and amplified by amplifying part 16. The amplified charges are output to the exterior of the solid-state image pickup device as output signals according to the respective pixels A.

By the above-described arrangement and operations, this embodiment's solid-state image pickup device provides the following effects. That is, supply wiring lines 13a and 13b, which are formed of a metal or metal silicide that blocks light and were priorly installed at dead zones at the respective ends of a CCD, are installed on top of pixels in the solid-state image pickup device of this embodiment. Since dead zones for installing supply wiring lines 13a and 13b can thus be eliminated from the respective ends of a CCD, photosensitive part 10 can be made wide in CCD 1.

Also, supply wiring lines 13a and 13b are arranged to cover just a part of each of light-shielded pixels D. Here, light is made incident on the other parts of light-shielded pixels D and output signals, which are lowered in output amounts to some degree, are output from the light-shielded pixels D. Thus with the solid-state image pickup device of the above-described arrangement, the amount of lowering of the incident light amount on light-shielded pixels D can be corrected based on the output signals that are lowered in output amounts.

FIG. 3A and FIG. 3B are tables showing (A) an example of output signal data from pixels A and (B) an example of output signal data from light-shielded pixels D and pixels A in an FFT CCD with 1024 columns and 64 rows. In regard to the method of correcting output signals, driving an FFT CCD by TDI drive, which shall be described later, is equivalent to adding the signals of the 64 pixels in the vertical direction. It thus becomes adequate to correct the output signals for the 1024 channels in the horizontal direction that correspond to the respective columns. Thus both the tables of FIG. 3A and FIG. 3B show variations of the output signals for the horizontal direction.

The pixel Nos. shown in FIG. 3A indicate the channel Nos. in the horizontal direction. In regard to the output signals, an example of the output signals of channels 1 to 4 and 1021 to 1024 is shown. The output signals of channels 5 to 1020 are omitted since these are substantially similar to those of channels 1 to 4 and channels 1021 to 1024.

As with FIG. 3A, the pixel Nos. shown in FIG. 3B indicate the channel Nos. in the horizontal direction. Likewise, in regard to the output signals, an example of the output signals of channels 1 to 4 and 1021 to 1024 is shown. However, the supply wiring lines are installed on top of the top surfaces of the pixels of columns H2 and H3 and columns H1022 and H1023, and the pixels of all of the corresponding channels are light-shielded pixels.

With pixels on which a supply wiring line is not installed, the mutual difference of the output signals of adjacent pixels is minute, as shown in FIG. 3A. However as shown in FIG. 3B, in comparison to the output signals of pixels on top of which a supply wiring line is not installed, the output signals of light-shielded pixels are lowered in accordance with the area covered by the supply wiring line, etc. By correcting for this lowered amount of output signal, the influence of the supply wiring line on the output signal can be eliminated.

As methods of correcting output signals from light-shielded pixels, such as shown in FIG. 3B, the following methods are effective.

That is, first, reference output signals, which are the output signals obtained upon making a light of substantially uniform intensity incident on the photosensitive part, are obtained. Then based on the reference output signals of the light-shielded pixels, the output signals of the same light-shielded pixels are corrected. Or, the output signals of light-shielded pixels may be corrected based on the reference output signals of pixels adjacent the light-shielded pixels.

Or, correction based on the output signals of the pixels adjacent the light-shielded pixels may be carried out without using reference output signals. That is, the output signals of the light-shielded pixels may be corrected using the correlation between the output signal values of the light-shielded pixels and the output signal values of the adjacent pixels that are not light-shielded pixels.

As an example of a correction method, there is a method wherein, based on reference output signals, a correction factor is computed such that the values obtained by multiplying the reference output signals of the light-shielded pixels by the correction factor become substantially equal to the values of the reference output signals of the pixels besides the light-shielded pixels, and in picking up an image of light, the output signals of the light-shielded-pixels, among the output signals obtained by the image pickup, are corrected by multiplying by the correction factor. By the above correction methods, the output signals of light-shielded pixels can be corrected readily.

For example, with a CCD, with which the pixel dimension is large such that one side of a pixel is approximately 48 µm, supply wiring lines of approximately 20 µm, which are smaller than the pixel dimension, are used. Though signals are lowered by amounts corresponding to the areas that are hidden by the supply wiring lines, since lowering of such degree is reproducible, it can be corrected by an above-described correction method.

With a CCD, with which the pixel dimension is small such that one side of a pixel is approximately 24 µm, the proportion of the light-shielded part becomes large and the correction error becomes large. In such a case, binning, in which the charges generated in a predetermined number (for example, 2×2=4) pixels are added together to form an output signal, may be carried out and correction of the output signals of the light-shielded pixels may be carried out thereafter.

Such binning is especially effective in cases where the present solid-state image pickup device is to be applied to a device with which a problem will not arise even if the resolution is lowered. For example, for X-ray image pickup, the resolution may be lower in comparison to visible light image pickup in many cases, and with panorama and cephalo x-ray image pickup devices used for treatment in dentistry, the resolution may be approximately 5 to 10 Lp/mm. Or, with a panorama X-ray image pickup device, a resolution of approximately 2 to 5 Lp/mm is sufficient. Here, 2 to 5 Lp/mm is a resolution, with which 2 to 5 black and white line pairs, drawn within a width of 1 mm, can be defined. This corresponds to a pixel dimension of approximately 200 to 500 µm. In a case where the solid-state image pickup device is to be used as a panorama or cephalo X-ray image pickup device, even when binning, in which the output signals, for example, of 2×2=4 pixels are added, is performed, such an X-ray image pickup device will function effectively as a sensor.

By performing binning as described above, a plurality of adjacent pixels can be handled as a unit pixel. The effects that the supply wiring lines have on the output signals of the unit pixels are thus lessened in comparison to those on the light-shielded pixels, and the output signals of the light-shielded pixels can be corrected favorably. For example, in the case where 2×2 binning is to be performed as described above and the supply wiring lines are to be installed on the top surfaces of two or more columns, the supply wiring lines should be installed so that the columns on which the supply wiring lines are installed will not be adjacent each other.

Also with the solid-state image pickup device illustrated in FIG. 1, FIG. 2A, and FIG. 2B, supply wiring lines 13a and 13b are installed on pixels of columns at the respective ends of photosensitive part 10. By such installation, vertical transfer voltages P1 and P2 can be applied efficiently onto transfer electrodes 12a to 12d from supply wiring lines 13a and 13b. Also, besides the present embodiment, by installing supply wiring lines 13a and 13b at columns substantially at the center of photosensitive part 10, the same effects as those of the present embodiment can be obtained. Furthermore, since the number of supply wiring lines will be the minimum necessary by the above configurations, the number of light-shielded pixels can be made low.

Supply wiring lines 13a and 13b are installed as a set of two wiring lines for applying the two-phase vertical transfer voltages P1 and P2 and the two supply wiring lines that form a set are installed above a single column of pixels. By installing the supply wiring lines in this manner, the number of light-shielded pixels D, which are required per set of supply wiring lines and with which the output signals are corrected, can be made low.

The TDI (Time Delay Integration) drive method can be cited as method of performing image pickup of image pickup subjects that move at a fixed velocity, such as objects on a belt conveyor, etc. In the TDI drive method, while performing charge transfer between potential wells at a rate that is in accordance with the movement velocity of the image pickup subjects, further accumulation of charges is performed to thereby perform image pickup of moving images of light without blur. Such a drive method is realized by the control of vertical transfer voltages P1 and P2 by the above-mentioned charge transfer control part 20. By charge transfer control part 20 of the solid-state image pickup device performing such charge transfer by the TDI drive method, image pickup objects moving at a fixed velocity can be picked up clearly. This TDI drive method is also used often in the above-mentioned panorama and cephalo X-ray image pickup devices as well.

The effect of eliminating dead zones by the above-described arrangement becomes especially effective in a solid-state image pickup device array, wherein a plurality of the solid-state image pickup devices are aligned in a manner such that photosensitive parts 10 are aligned adjacent each other in the horizontal direction.

Figure 4:
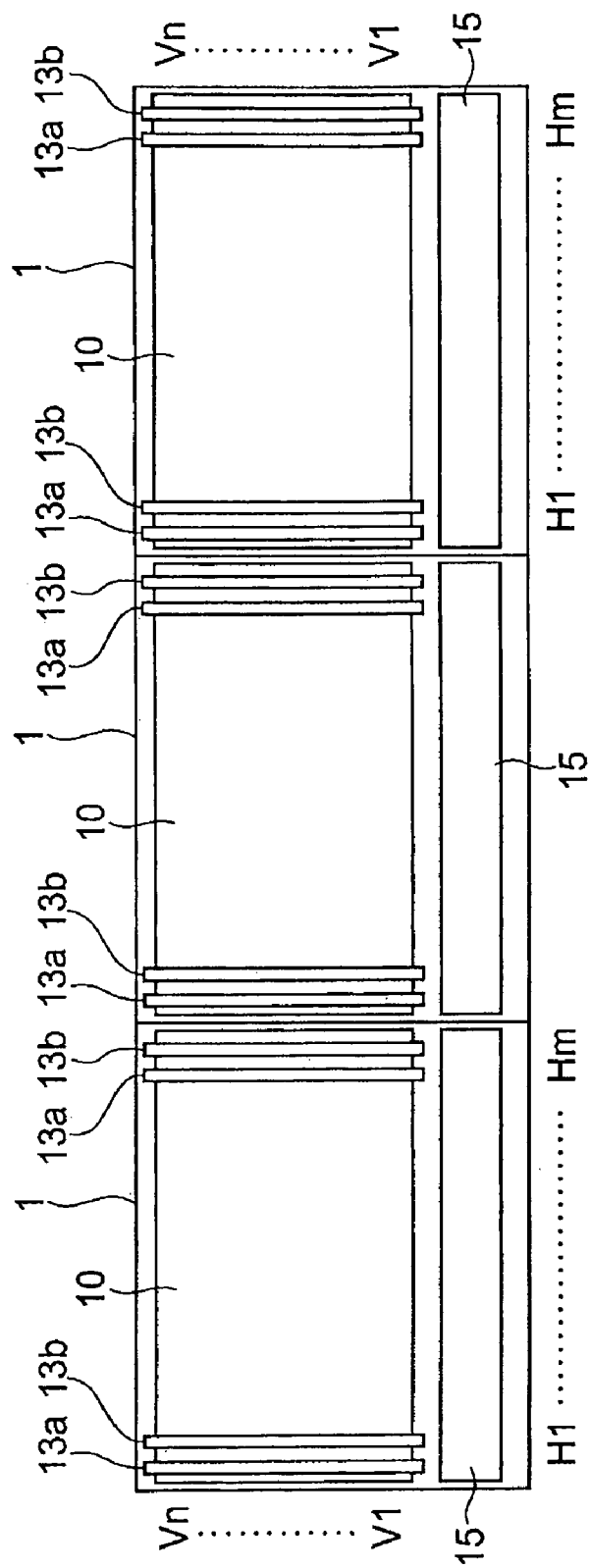
FIG. 4 is a schematic arrangement diagram of a solid-state image pickup device array using this invention's solid-state image pickup devices as viewed from the top surface side.
Figures 7A, 7B:
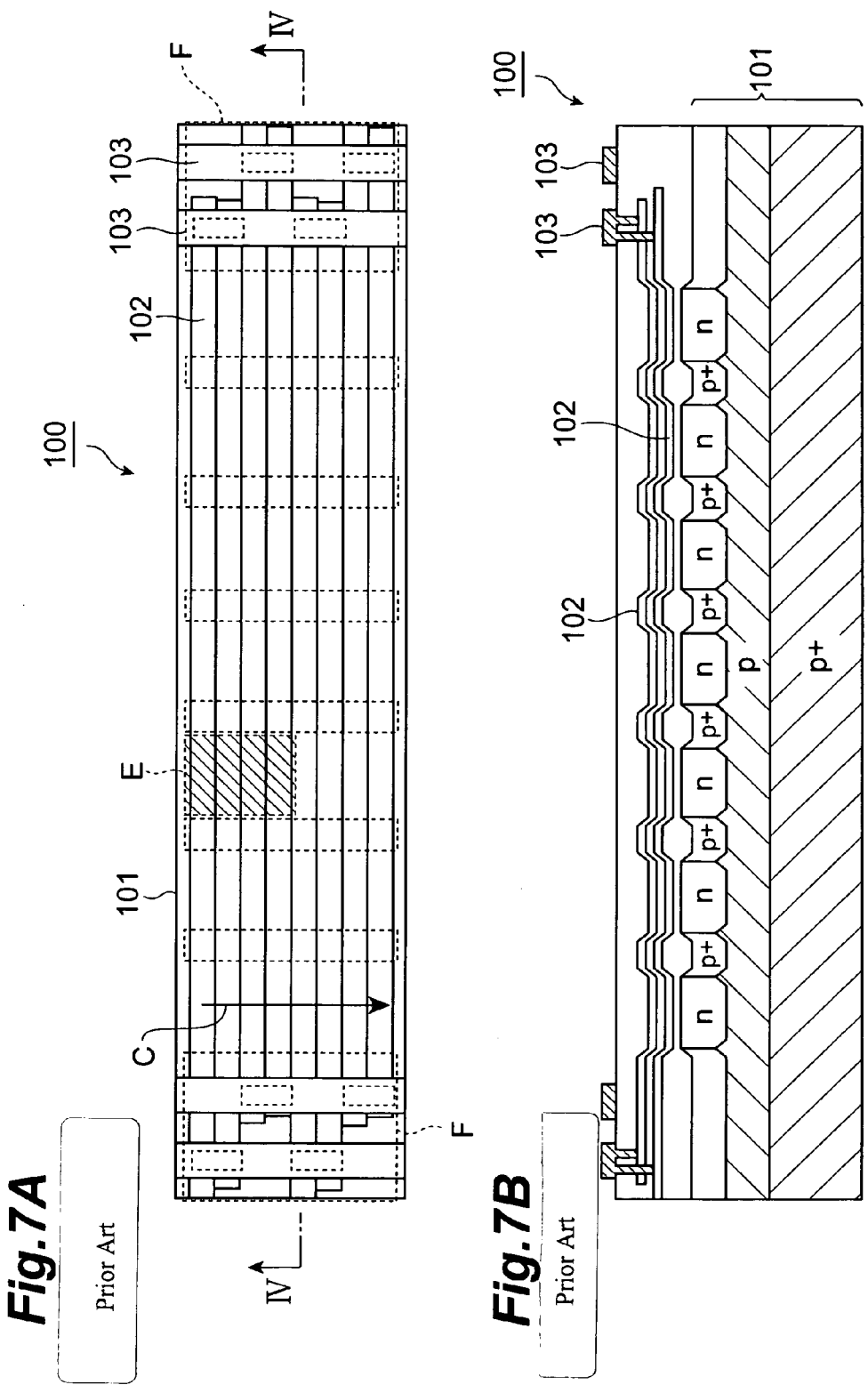
FIG. 7A and FIG. 7B are (A) a top view of a prior-art full-frame transfer solid-state image pickup device (FFT CCD) or frame transfer (FT) CCD for the case of two-phase drive and (B) a sectional view along the arrows IV—IV of the same.

FIG. 4 is a schematic arrangement diagram of a solid-state image pickup device array using this invention's solid-state image pickup devices as viewed from the top surface side. With the solid-state image pickup device array shown in FIG. 4, a plurality of CCDs 1, shown in FIG. 1, are aligned so as to be adjacent each other in the horizontal direction.

With a solid-state image pickup device array, an image pickup subject of large dimensions, which cannot be picked up with a single solid-state image pickup device, is picked up by a plurality of solid-state image pickup devices. With the prior-art solid-state image pickup device array, the respective end parts of each photosensitive part at which the supply wiring lines are installed are not used as photosensitive parts and pixels are not disposed thereat. Thus with an image that is picked up across a plurality of the photosensitive parts, a fixed amount of non-image-pickup parts arise in the interior of the image due to dead zones for supply wiring line installation that exist between the respective photosensitive parts.

With the solid-state image pickup device array shown in FIG. 4, since dead zones for the installation of supply wiring lines are eliminated by the installation of supply wiring lines 13a and 13b on top of pixels in the solid-state image pickup devices, the non-image-pickup parts that exist in an image picked up by the solid-state image pickup device array can be made small.

Here, an example of an X-ray image pickup device used for treatment in dentistry shall be described. With a cephalo X-ray image pickup device used for treatment in dentistry, a length of approximately 220 mm is required as the length of an effective photosensitive region, which is a region in the solid-state image pickup device wherein image pickup is enabled, and with a panorama X-ray image pickup device, a length of approximately 150 mm is required for the effective photosensitive region. However, it is difficult to realize an effective photosensitive region of such length with a single solid-state image pickup device. A plurality of solid-state image pickup devices are thus aligned and set on a ceramic or printed circuit board to obtain the length required of the effective photosensitive region.

With the prior-art solid-state image pickup device, if the width of the dead zone at one end part of a photosensitive part is, for example, 100 μm and the width of the dead zone at the other end is 200 μm, a dead zone of 300 μm in total is formed at each seam between photosensitive parts. Due to these dead zones, non-image-pickup parts exist in a picked-up image and this can influence diagnosis in dentistry. The existence of non-image-pickup parts in a picked-up image is thus a problem with prior-art solid-state image pickup device arrays. However, by using the solid-state image pickup device array shown in FIG. 4, dead zones due to the installation of supply wiring lines are eliminated and the non-image-pickup parts can be made small.

FIG. 5A and FIG. 5B are (A) a top view and (B) a section along arrows II—II showing a part of the arrangement of a CCD 2 of a solid-state image pickup device of a second embodiment. CCD 2, shown in FIG. 5A and FIG. 5B, comprises a semiconductor substrate 11, transfer electrodes 12a to 12d, supply wiring lines 23a and 23b, and an insulating layer 14. Of these, since the arrangements of parts besides supply wiring lines 23a and 23b are the same as those of the solid-state image pickup device of the first embodiment, description thereof shall be omitted.

Supply wiring lines 23a and 23b are installed on the top surfaces of columns H1, Hm, and a substantially central column with their longitudinal direction being set along the direction parallel to the respective columns Hi of photosensitive part 10. Also, a protruding part 231a is disposed on the supply wiring line 23a and a protruding part 231b is disposed on the supply wiring line 23b, and via these protruding parts, vertical transfer voltage P1 is applied to transfer electrodes 12a and 12b and vertical transfer voltage P2 is applied to transfer electrodes 12c and 12d.

With the solid-state image pickup device of the present embodiment, since the dead zones for installing supply wiring lines 23a and 0.23b can be eliminated from the respective ends of a CCD, photosensitive part 10 in CCD 2 can be made wide. Also, supply wiring lines 23a and 23b are arranged to cover only a part of each light-shielded pixel D. The amount of lowering of the incident light amount on light-shielded pixels D can thus be corrected based on the output signals that are lowered in output amounts.

Also, in addition to the positions in the first embodiment, a set of supply wiring lines 23a and 23b are installed on the top surface of the substantially central column of photosensitive part 10. The distances between supply wiring lines 23a mutually and the distances between supply wiring lines 23b mutually are thus shortened. Since the influence due to the electrical resistances of transfer electrodes 12a to 12d can thus be restrained at a low level, the charge transfer rate of CCD 2 can be made high and CCD 2 can be driven at high speed.

Supply wiring lines 23a and 23b may be installed just on the top surface of the substantially central column of photosensitive part 10. By such installation, vertical transfer voltages P1 and P2 can be applied efficiently onto transfer electrodes 12a to 12d from supply wiring lines 23a and 23b. Also, since the number of supply wiring lines becomes the minimum necessary, the number of light-shielded pixels can be made low.

FIG. 6A and FIG. 6B are (A) a top view and (B) a section along arrows III—III showing a part of the arrangement of a CCD 3 of a solid-state image pickup device of a third embodiment. CCD 3, shown in FIG. 6A and FIG. 6B, comprises a semiconductor substrate 11, transfer electrodes 12a to 12d, supply wiring lines 33a and 33b, and an insulating layer 14. Of these, since the arrangements of parts besides supply wiring lines 33a and 33b are the same as those of the solid-state image pickup device of the first embodiment, description thereof shall be omitted.

Supply wiring lines 33a and 33b are installed on the top surfaces of arbitrary columns Hi on the top surface of insulating layer 14, with their longitudinal direction being set along the direction parallel to the respective columns Hi of photosensitive part 10. Here, supply wiring lines 33a and 33b are installed on mutually different columns. Also, a protruding part 331a is disposed on the supply wiring line 33a and a protruding part 331b is disposed on the supply wiring line 33b, and via these protruding parts, vertical transfer voltage P1 is applied to transfer electrodes 12a and 12b and vertical transfer voltage P2 is applied to transfer electrodes 12c and 12d.

With the solid-state image pickup device of the present embodiment, since the dead zones for installing supply wiring lines 33a and 33b can be eliminated from the respective ends of a CCD, photosensitive part 10 in CCD 3 can be made wide. Also, supply wiring lines 33a and 33b are arranged to cover only a part of each light-shielded pixel D. The amount of lowering of the incident light amount on light-shielded pixels D can thus be corrected based on the output signals that are lowered in output amounts.

Also, with supply wiring lines 33a and 33b, the two supply wiring lines that form a set for applying the two-phase vertical transfer voltages P1 and P2 are installed on top of pixels of mutually different columns. By the supply wiring lines being installed in this manner, the area covered by supply wiring lines of each light-shielded pixel is lessened and the lowering of the incident light amount onto the light-shielded pixels is thus made small. The correction of the output signals of the light-shielded pixels can thereby be facilitated.

This invention's solid-state image pickup device is not restricted to the above-described embodiments and various modifications are possible. For example, with regard to the supply wiring lines, an arbitrary number thereof may be installed on the top surfaces of pixels at arbitrary locations besides those of the above-described embodiments and may thus be designed as suitable according to the required charge transfer rate, correction method, etc.

Also, with each of the above-described embodiments, a two-phase drive CCD is used. Besides this, even when a CCD of three-phase drive or higher is used, a solid-state image pickup device by this invention can be arranged favorably by installing the required number of supply wiring lines on top of pixels.

Also, though with each of the above-described embodiments, an FFT CCD is used as the CCD, another type of CCD may be used instead. For example, by equipping the supply wiring lines of the above-described arrangement in a frame transfer type CCD (FT CCD), having a charge accumulating part between a photosensitive part and a horizontal shift register, the photosensitive part of the solid-state image pickup element can be made wide.

INDUSTRIAL APPLICABILITY

This invention's solid-state image pickup device and solid-state image pickup device array can be used as a solid-state image pickup device and solid-state image pickup device array, with which the dead zones can be made small and the photosensitive parts can be made wide. That is, with the solid-state image pickup device, since by the installing of supply wiring lines, which are formed of light-blocking material, on top of pixels, the dead zones for installing supply wiring lines, which existed at the respective end parts in the horizontal direction of the photosensitive part in the prior art, can be eliminated, the photosensitive part can be made wide. Also by eliminating the dead zones of the solid-state image pickup device, parts at which image pickup is not performed can be lessened in cases where a plurality of the solid-state image pickup devices are used adjacent each other in the horizontal direction. Also, the supply wiring lines are arranged to cover only a part of the light-shielded pixels. Since light is made incident on the other parts of the light-shielded pixels, output signals, which are lowered to some degree in output amount, are output from the light-shielded pixels. Thus with the solid-state image pickup device of the above arrangement, the lowering of the incident light amount on the light-shielded pixels can be corrected based on the output signal.

Also, with the solid-state image pickup device array, since the intervals between the respective photosensitive parts can be made narrow by the use of the above-described solid-state image pickup devices, non-image-pickup parts that exist in an image that has been picked up by the solid-state image pickup device array can be made small.

What is claimed is:

1. A solid-state image pickup device comprising:
   a photosensitive part, having m×n pixels, formed on a semiconductor substrate, which includes a p-type semiconductor layer and an n-type semiconductor layer, and aligned two-dimensionally along m columns (where m is an integer of 2 or more), which partition a horizontal direction, and n rows (where n is an integer of 2 or more), which partition a vertical direction, and picking up an image of light that is made incident thereon;
   a transfer electrode, being installed on top of said pixels with the longitudinal direction thereof being set along the horizontal direction of said photosensitive part and being applied a vertical transfer voltage that transfers charges generated in said pixels in the vertical direction; and
   a supply wiring line, formed of metal or metal silicide, installed so as to cover a part of a light-shielded pixel, which is a predetermined pixel among said pixels, and with the longitudinal direction thereof being set along the vertical direction of said photosensitive part, being electrically connected to said transfer electrode, and applying said vertical transfer voltage to said transfer electrode;
   wherein being arranged to enable correction of the amount of lowering of an output signal, output by said light-shielded pixel, due to said supply wiring line.

2. The solid-state image pickup device according to claim 1, wherein said supply wiring lines are installed on top of said pixels of columns, among said m columns, at the respective ends of said photosensitive part.

3. The solid-state image pickup device according to claim 1, wherein said supply wiring line is installed on top of said pixels of a substantially central column, among said m columns of said photosensitive part.

4. The solid-state image pickup device according to claim 1, wherein said supply wiring line is installed as a set of k supply wiring lines (where k is an integer of 2 or more) for applying said vertical transfer voltages of k phases and the k said supply wiring lines that form a set are installed on top of said pixels of one column.

5. The solid-state image pickup device according to claim 1, wherein said supply wiring line is installed as a set of k supply wiring lines (where k is an integer of 2 or more) for applying said vertical transfer voltages of k phases and the k said supply wiring lines that form a set are installed in a dispersed manner along a plurality of columns.

6. The solid-state image pickup device according to claim 1, wherein light of substantially uniform intensity is made incident in advance on said photosensitive part to determine a reference output signal and the output signal of said light-shielded pixel is corrected based on said reference output signal.

7. The solid-state image pickup device according to claim 1, wherein the output signal of said light-shielded pixel is corrected based on the output signal of the non-light-shielded pixel adjacent said light-shielded pixel.

8. The solid-state image pickup device according to claim 1, wherein binning, in which the charges generated in a predetermined number of said pixels are added to form an output signal, is performed.

9. The solid-state image pickup device according to claim 1, wherein said vertical transfer voltage is controlled by the TDI drive method, in which charges are transferred in the vertical direction at a rate corresponding to the movement velocity of an image pickup subject to perform image pickup without blur of said image of light of said image pickup subject.

10. A solid-state image pickup device array wherein a plurality of the solid-state image pickup devices according to claim 1 are aligned in a mutually adjacent manner with said photosensitive parts being aligned in the horizontal direction.

* * * * *